United States Patent
Hatsuda

(10) Patent No.: US 11,005,444 B2
(45) Date of Patent: May 11, 2021

(54) ACOUSTIC WAVE DEVICE, RADIO-FREQUENCY FRONT END CIRCUIT, AND COMMUNICATION DEVICE

(71) Applicant: Murata Manufacturing Co., Ltd., Nagaokakyo (JP)

(72) Inventor: Ippei Hatsuda, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 15/929,139

(22) Filed: Jun. 6, 2019

(65) Prior Publication Data

US 2019/0288665 A1    Sep. 19, 2019

Related U.S. Application Data

(63) Continuation of application No. PCT/JP2017/036861, filed on Oct. 11, 2017.

(30) Foreign Application Priority Data

Dec. 16, 2016 (JP) .............................. JP2016-244127

(51) Int. Cl.
*H03H 9/02* (2006.01)
*H03H 9/10* (2006.01)
(Continued)

(52) U.S. Cl.
CPC ......... *H03H 9/02897* (2013.01); *H01L 23/02* (2013.01); *H01L 23/10* (2013.01);
(Continued)

(58) Field of Classification Search
CPC .. H03H 9/02897; H03H 3/10; H03H 9/02559; H03H 9/02834; H03H 9/059;
(Continued)

(56) References Cited

U.S. PATENT DOCUMENTS

2011/0018389 A1    1/2011   Fukano et al.
2016/0049920 A1*   2/2016   Kishino ............. H03H 9/02992
                                                    343/858
(Continued)

FOREIGN PATENT DOCUMENTS

JP    2010-157956 A    7/2010
JP    2010-278972 A    12/2010
(Continued)

OTHER PUBLICATIONS

Machine English Translation of WO2016199480 A1 Published on Dec. 15, 2016 (Year: 2016).*

(Continued)

*Primary Examiner* — Rakesh B Patel
*Assistant Examiner* — Jorge L Salazar, Jr.
(74) *Attorney, Agent, or Firm* — Keating & Bennett, LLP

(57) ABSTRACT

An acoustic wave device includes a piezoelectric substrate, an IDT electrode provided on the piezoelectric substrate, a support provided on the piezoelectric substrate so as to surround the IDT electrode, and a cover provided on the support. The support has a larger thermal expansion coefficient than the piezoelectric substrate. The IDT electrode is provided in a hollow space that is surrounded by the piezoelectric substrate, the support, and the cover. The support includes an inner surface on a side of the hollow space, and an outer surface on a side opposite to the inner surface, and the support includes a recess provided in at least one of the inner and outer surfaces.

17 Claims, 7 Drawing Sheets

(51) Int. Cl.
    *H03F 3/20*     (2006.01)
    *H03H 3/10*     (2006.01)
    *H03H 9/05*     (2006.01)
    *H03H 9/145*     (2006.01)
    *H03H 9/25*     (2006.01)
    *H01L 23/10*     (2006.01)
    *H01L 23/02*     (2006.01)
    *H04B 1/40*     (2015.01)

(52) U.S. Cl.
    CPC ................. *H03F 3/20* (2013.01); *H03H 3/10* (2013.01); *H03H 9/02559* (2013.01); *H03H 9/02834* (2013.01); *H03H 9/059* (2013.01); *H03H 9/1092* (2013.01); *H03H 9/145* (2013.01); *H03H 9/25* (2013.01); *H01L 2924/16235* (2013.01); *H03F 2200/165* (2013.01); *H03F 2200/171* (2013.01); *H03F 2200/294* (2013.01); *H03F 2200/451* (2013.01); *H04B 1/40* (2013.01)

(58) Field of Classification Search
    CPC ........ H03H 9/1092; H03H 9/145; H03H 9/25; H03H 9/02574; H03H 3/08; H03H 9/1042; H03H 9/1071; H03H 9/02614; H01L 23/10; H01L 23/02; H01L 2924/16235; H03F 3/20; H03F 2200/165; H03F 2200/171; H03F 2200/294; H03F 2200/451; H03F 3/195; H03F 3/245; H04B 1/40
    USPC .......................................... 333/133, 193–196
    See application file for complete search history.

(56) References Cited

U.S. PATENT DOCUMENTS

| | | |
|---|---|---|
| 2017/0359049 A1 | 12/2017 | Toyota |
| 2018/0102758 A1 | 4/2018 | Uesaka |

FOREIGN PATENT DOCUMENTS

| | | |
|---|---|---|
| JP | 2011-199823 A | 10/2011 |
| JP | 2014-036091 A | 2/2014 |
| WO | 2009096563 A1 | 8/2009 |
| WO | 2016/147724 A1 | 9/2016 |
| WO | 2016199480 A1 | 12/2016 |

OTHER PUBLICATIONS

Official Communication issued in International Patent Application No. PCT/JP2017/036861, dated Dec. 19, 2017.

\* cited by examiner

ACOUSTIC WAVE DEVICE, RADIO-FREQUENCY FRONT END CIRCUIT, AND COMMUNICATION DEVICE

CROSS REFERENCE TO RELATED APPLICATIONS

This application claims the benefit of priority to Japanese Patent Application No. 2016-244127 filed on Dec. 16, 2016 and is a Continuation Application of PCT Application No. PCT/JP2017/036861 filed on Oct. 11, 2017. The entire contents of each application are hereby incorporated herein by reference.

BACKGROUND OF THE INVENTION

1. Field of the Invention

The present invention relates to an acoustic wave device, a radio-frequency front end circuit, and a communication device.

2. Description of the Related Art

Acoustic wave devices have been widely used in filters of mobile phone devices and the like. Japanese Unexamined Patent Application Publication No. 2010-278972 discloses an example of an acoustic wave device. The acoustic wave device includes a piezoelectric substrate, a support that is provided on the piezoelectric substrate, and a cover that is provided on the support. An IDT electrode is provided on the piezoelectric substrate. The IDT electrode is formed inside a hollow space surrounded by the piezoelectric substrate, the support, and the cover. Thus, the acoustic wave device disclosed in Japanese Unexamined Patent Application Publication No. 2010-278972 is an acoustic wave device having a wafer level package (WLP) structure.

Heat is applied to an acoustic wave device in a manufacturing process and a mounting process. Furthermore, when an acoustic wave device is used, the acoustic wave device may be heated to a high temperature due to heat generated by the IDT electrode and heat applied from outside the acoustic wave device.

In the WLP-structure acoustic wave device disclosed in Japanese Unexamined Patent Application Publication No. 2010-278972, the support has a larger thermal expansion coefficient than the piezoelectric substrate, and therefore, the support tends to deform by a greater amount than the piezoelectric substrate with changes in temperature. Therefore, a large thermal stress may act on the piezoelectric substrate and the piezoelectric substrate may be damaged.

SUMMARY OF THE INVENTION

Preferred embodiments of the present invention provide acoustic wave devices, radio-frequency front end circuits, and communication devices that are each able to disperse stress acting on a piezoelectric body such as a piezoelectric substrate and in which the piezoelectric body is unlikely to be damaged.

An acoustic wave device according to a preferred embodiment of the present invention includes a piezoelectric body; a functional electrode provided on the piezoelectric body; a support provided on the piezoelectric body so as to surround the functional electrode; and a cover provided on the support. The support has a larger thermal expansion coefficient than the piezoelectric body. The functional electrode is provided inside a hollow space surrounded by the piezoelectric body, the support, and the cover. The support includes an inner surface on a side of the hollow space, and an outer surface on a side opposite to the inner surface. The support includes a recess that is provided in at least one of the inner surface and the outer surface.

In an acoustic wave device according to a preferred embodiment of the present invention, when a depth of the recess is a dimension of the recess in a direction that connects the inner surface and the outer surface of the support, a portion of the recess at which the depth is largest is closer to the piezoelectric body than to the cover. In this case, the portion of the recess is close to the piezoelectric-body in which stress is likely to be concentrated because the piezoelectric-body side of the support is less likely to deform, and therefore, stress acting on the piezoelectric body is able to be further dispersed.

In an acoustic wave device according to a preferred embodiment of the present invention, the support includes a plurality of corners in a plan view, and the recess is provided at at least one corner among the plurality of corners. In this case, since stress is particularly likely to be concentrated at a corner, the stress acting on the piezoelectric body is able to be more effectively dispersed.

In an acoustic wave device according to a preferred embodiment of the present invention, the recess is provided in the outer surface of the support. In this case, since stress is more likely to be concentrated on the outer surface than the inner surface, the stress acting on the piezoelectric body is able to be more effectively dispersed.

In an acoustic wave device according to a preferred embodiment of the present invention, the support has a frame shape in a plan view, and the recess is provided along an entire or substantially an entire periphery of the support. In this case, since the locations at which stress is absorbed are uniformly provided over a wide region, the stress acting on the piezoelectric body is able to be further dispersed.

In an acoustic wave device according to a preferred embodiment of the present invention, the functional electrode is an IDT electrode.

A radio-frequency front end circuit according to a preferred embodiment of the present invention includes an acoustic wave device according to a preferred embodiment of the present invention and a power amplifier.

A communication device according to a preferred embodiment of the present invention includes a radio-frequency front end circuit according to a preferred embodiment of the present invention and an RF signal processing circuit.

According to preferred embodiments of the present invention, acoustic wave devices, radio-frequency front end circuits, and communication devices are provided that are able to disperse stress acting on a piezoelectric body such as a piezoelectric substrate and in which the piezoelectric body is unlikely to be damaged.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, preferred embodiments of the present invention will be described in detail with reference to the accompanying drawings.

The preferred embodiments described in the present specification are illustrative examples and it should be noted that portions of the configurations illustrated in different preferred embodiments may be substituted for one another or combined with one another.

Figure 1:
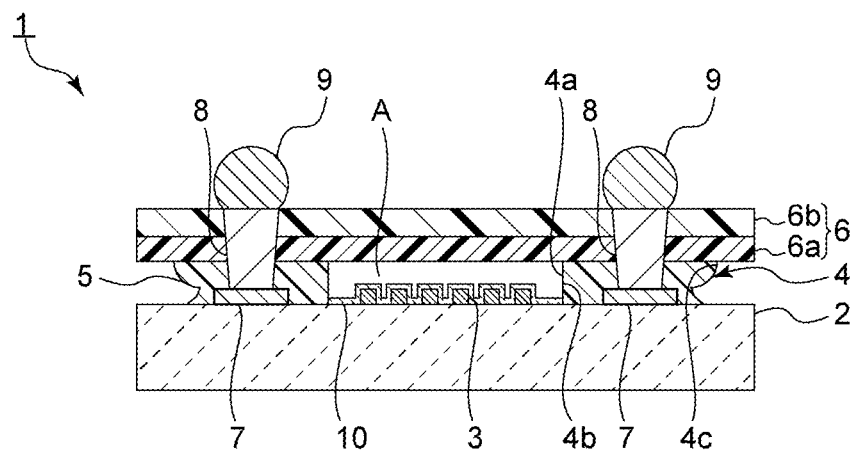
FIG. 1 is a front sectional view of an acoustic wave device according to a first preferred embodiment of the present invention.
Figure 2:
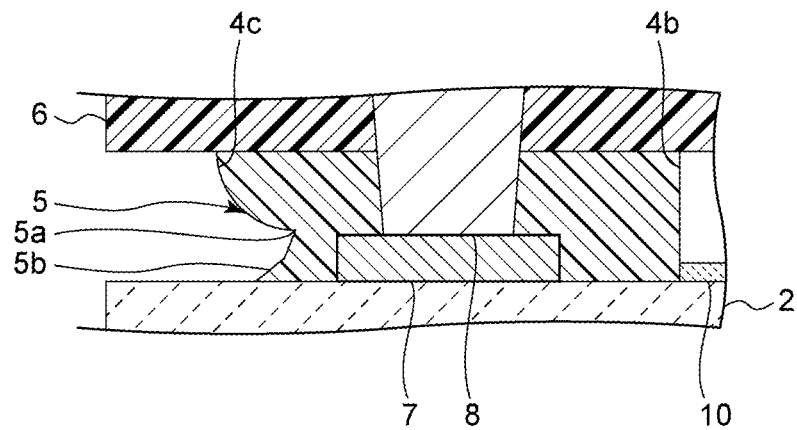
FIG. 2 is an enlarged front sectional view of a region in the vicinity of a support in the first preferred embodiment of the present invention.
Figure 3:
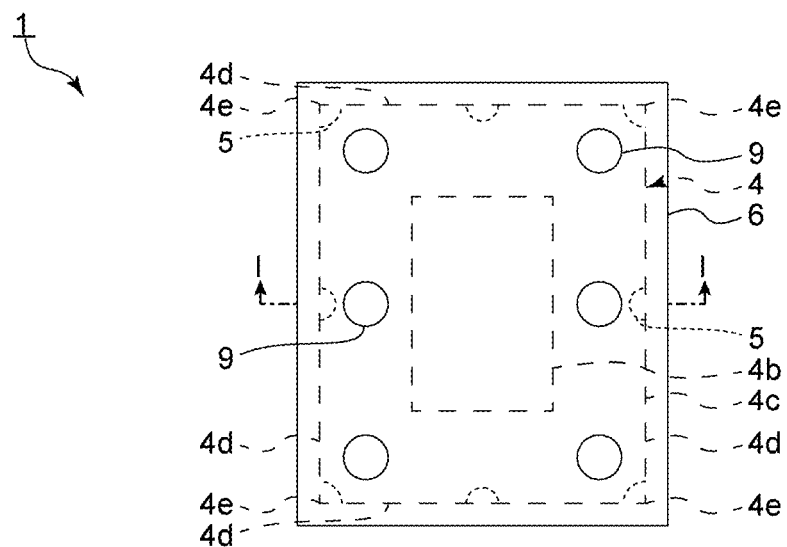
FIG. 3 is a plan view of the acoustic wave device according to the first preferred embodiment of the present invention.

FIG. 1 is a front sectional view of an acoustic wave device according to a first preferred embodiment of the present invention. FIG. 2 is an enlarged front sectional view of a region in the vicinity of a support in the first preferred embodiment. FIG. 3 is a plan view of the acoustic wave device according to the first preferred embodiment of the present invention. FIG. 1 is a sectional view taken along line I-I in FIG. 3.

As illustrated in FIG. 1, an acoustic wave device 1 includes a piezoelectric substrate 2 as a piezoelectric body. The piezoelectric substrate 2 is preferably made of a piezoelectric single crystal such as $LiNbO_3$ or $LiTaO_3$. The piezoelectric substrate 2 may be composed of a suitable piezoelectric ceramic.

In the present preferred embodiment, an IDT electrode 3 is provided as a functional electrode on the piezoelectric substrate 2. The functional electrode may be a functional electrode other than an IDT electrode. Electrode pads 7, which are electrically connected to the IDT electrode 3, are also provided on the piezoelectric substrate 2.

The IDT electrode 3 includes an electrode layer that is preferably made of, for example, Ti, Al, Cu, Pt, W, Mo, NiCr, Au, or other suitable material. The IDT electrode 3 may be made of a multilayer metal film in which a plurality of electrode layers are stacked or may include a single electrode layer. The electrode pads 7 are preferably made of the same material as the IDT electrode 3.

A dielectric film 10 is provided on the piezoelectric substrate 2 so as to cover the IDT electrode 3. The dielectric film 10 is preferably made of, for example, $SiO_2$, SiN, or other suitable material. Due to the presence of the dielectric film 10, the IDT electrode 3 is unlikely to be damaged. Furthermore, in the case in which the dielectric film 10 is made of SiN, frequency adjustment is able to be easily performed. In addition, the dielectric film 10 does not have to be provided.

A support 4 including an opening 4a is provided on the piezoelectric substrate 2. The support 4 is provided such that the IDT electrode 3 is surrounded by the opening 4a. The support 4 is preferably made of, for example, an appropriate resin or other suitable material. Consequently, the support 4 has a larger thermal expansion coefficient than the piezoelectric substrate 2.

A cover 6 is provided on the support 4 so as to cover the opening 4a. In the present preferred embodiment, the cover 6 includes an adhesive layer 6a and a protective layer 6b that is stacked on the adhesive layer 6a. The adhesive layer 6a is preferably made of, for example, an acrylic ester based resin. The protective layer 6b is preferably made of, for example, PI. As a result, the strength of the bond between the support 4 and the cover 6 is able to be increased and the durability of the acoustic wave device is also able to be increased. The materials of the cover 6 are not limited to the above-described examples. The cover 6 may include a single layer.

The acoustic wave device 1 includes a hollow space A that is surrounded by the piezoelectric substrate 2, the support 4, and the cover 6. The IDT electrode 3 is located inside the hollow space A.

The support 4 includes an inner surface 4b, which is a surface on the side of the hollow space A, and an outer surface 4c, which is a surface on the opposite side from the inner surface 4b. When a direction that connects the piezoelectric substrate 2 and the cover 6 to each other is a height direction, the outer surface 4c of the support 4 extends in an inclined manner with respect to the height direction. The outer surface 4c of the support 4 may instead extend in a direction parallel or substantially parallel to the height direction.

In the present preferred embodiment, recesses 5 are provided in the outer surface 4c. More specifically, as illustrated in FIG. 2, each recess 5 is provided in the outer surface 4c so as to extend from a point between the cover 6 and the piezoelectric substrate 2 to the portion that contacts the piezoelectric substrate 2. Here, the depth of the recess 5 is the length of the recess 5 in a direction that connects the inner surface 4b and the outer surface 4c to each other.

The recess 5 includes a bottom portion 5a that is a portion of the recess 5 having the largest depth. The position of the bottom portion 5a is closer to the piezoelectric substrate 2 than to the cover 6 in the height direction. The depth of the recess 5 gradually decreases in a direction from the bottom portion 5a toward the portion of the recess 5 that contacts the piezoelectric substrate 2. Thus, the recess 5 includes an inclined surface 5b that is located between the bottom portion 5a and the portion of the recess 5 that contacts the piezoelectric substrate 2. The shape of the recess 5 is not limited to this example.

As illustrated in FIG. 3, the support 4 has a rectangular or substantially rectangular frame shape in a plan view. The support 4 includes four sides 4d and four corners 4e. The recesses 5 are respectively provided in the vicinities of the centers of the four sides 4d and at the four corners 4e of the outer surface 4c. The positions at which the recesses 5 are provided in the support 4 are not limited to the above-described examples. It is sufficient that the recesses 5 are provided in at least one of the inner surface 4b and the outer surface 4c.

Returning to FIG. 1, via electrodes 8 penetrate through the support 4 and the cover 6. One end of each via electrode 8 is connected to a corresponding electrode pad 7. Bumps 9 are bonded to the other ends of the via electrodes 8. The bumps 9 are preferably made of solder, for example. The IDT electrode 3 is electrically connected to the outside via the electrode pads 7, the via electrodes 8, and the bumps 9. Thus, the acoustic wave device 1 of the present preferred embodiment is a WLP-structure acoustic wave device.

A feature of the present preferred embodiment is that the support 4 includes the recesses 5 provided in the outer surface 4c thereof. Due to this feature, thermal stress is able to be dispersed and the piezoelectric substrate 2 is unlikely to be damaged. This will be described below by comparing the present preferred embodiment and first to third comparative examples.

The first to third comparative examples differ from the first preferred embodiment in that the first to third comparative examples do not include the recesses. The outer surface of the support in the first comparative example extends parallel or substantially parallel to the height direction. The entire or substantially the entire outer surface of the support in the second comparative example extends in an inclined manner with respect to the height direction. The outer surface of the support in the third comparative example extends in an inclined manner with respect to the height direction in the vicinity of a portion of the outer surface that contacts the piezoelectric substrate and the remainder of the outer surface extends parallel or substantially parallel to the height direction.

The thermal stress distributions in the first preferred embodiment and the first to third comparative examples were compared.

Figure 4:
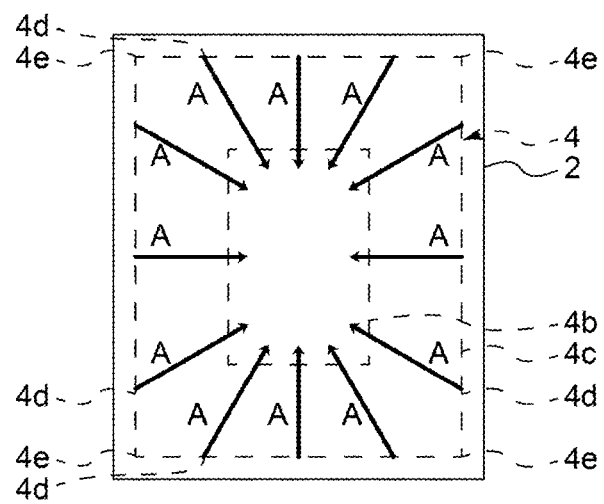
FIG. 4 is a schematic plan view that schematically illustrates thermal stress that acts on a piezoelectric substrate from a support in an WLP-structure acoustic wave device.
Figure 5:
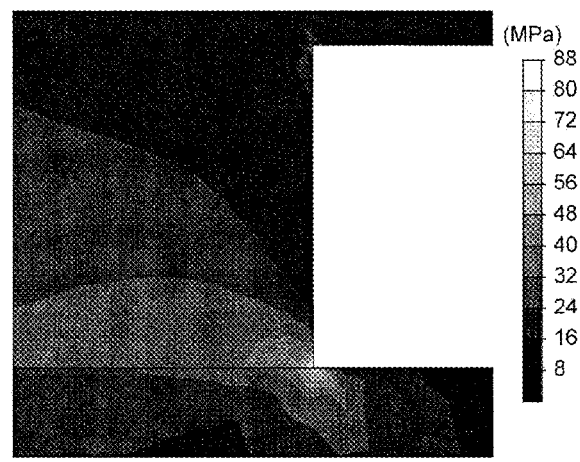
FIG. 5 is an enlarged front sectional view illustrating the distribution of thermal stress in a piezoelectric substrate, a support, and a cover in a first comparative example.
Figure 6:
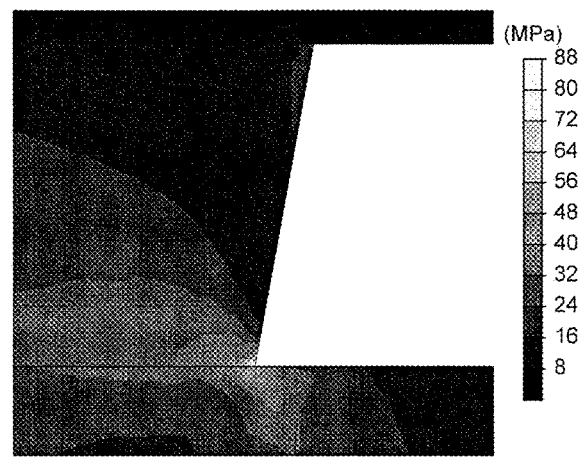
FIG. 6 is an enlarged front sectional view illustrating the distribution of thermal stress in a piezoelectric substrate, a support, and a cover in a second comparative example.
Figure 7:
FIG. 7 is an enlarged front sectional view illustrating the distribution of thermal stress in a piezoelectric substrate, a support, and a cover in a third comparative example.
Figure 8:
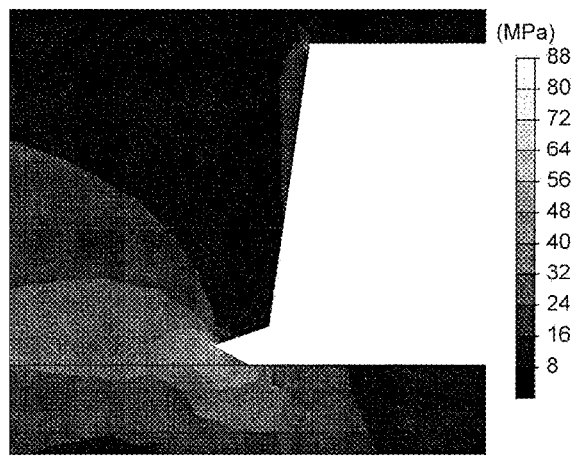
FIG. 8 is an enlarged front sectional view illustrating the distribution of thermal stress in a piezoelectric substrate, a support, and a cover in the first preferred embodiment of the present invention.

FIG. 4 is a schematic plan view that schematically illustrates thermal stress that acts on a piezoelectric substrate from a support in a WLP-structure acoustic wave device. FIG. 5 is an enlarged front sectional view illustrating the distribution of thermal stress in the piezoelectric substrate, the support, and the cover in the first comparative example. FIG. 6 is an enlarged front sectional view illustrating the distribution of thermal stress in the piezoelectric substrate, the support, and the cover in the second comparative example. FIG. 7 is an enlarged front sectional view illustrating the distribution of thermal stress in the piezoelectric substrate, the support, and the cover in the third comparative example. FIG. 8 is an enlarged front sectional view illustrating the distribution of thermal stress in the piezoelectric substrate, the support, and the cover in the first preferred embodiment. The cover, the via electrodes, and the electrode pads are omitted from FIG. 4.

A large thermal stress acts on the piezoelectric substrate from the support due to a temperature cycle in which the temperature of the acoustic wave device rises due to heat being applied thereto and the temperature of the acoustic wave device falls due to heat being radiated from the acoustic wave device. More specifically, as indicated by arrows A in FIG. 4, stress acts from the outer surface 4c side of the support 4 toward the inner surface 4b side of the support 4. As illustrated in FIG. 5, in the first comparative example, it is clear that stress is concentrated in a portion at which the support and the piezoelectric substrate contact each other. In the first comparative example, the maximum value of stress is about 79.988 MPa.

As illustrated in FIGS. 6 and 7, in the second and third comparative examples as well, it is clear that stress is concentrated in a portion at which the support and the piezoelectric substrate contact each other. In the second comparative example, the maximum value of stress is about 87.849 MPa. In the third comparative example, the maximum value of stress is about 66.36 MPa. Thus, in the first to third comparative examples, a large stress acts on the piezoelectric substrate, and therefore, the piezoelectric substrate is likely to be damaged.

In contrast, in the first preferred embodiment, the support includes recesses provided in the outer surface thereof. Consequently, as illustrated in FIG. 8, it is clear that the stress is dispersed. It is clear that the stress acting on the piezoelectric substrate is reduced due to the stress being dispersed. The maximum value of the stress is about 50.33 MPa, which is at least about 16 MPa smaller than the maximum values in the first to third comparative examples. Furthermore, the portions at which the stress is at a maximum care able to be positioned in the vicinities of the bottom portions of the recesses, and the piezoelectric substrate is able to be moved away from the portions at which the greatest stress is acting. Therefore, the stress acting on the piezoelectric substrate is able to be effectively reduced. Therefore, the piezoelectric substrate is able to be effectively made less likely to be damaged.

Figure 9:
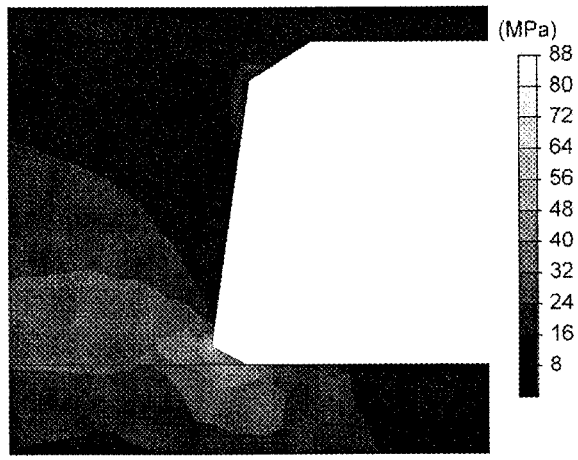
FIG. 9 is an enlarged front sectional view illustrating the distribution of thermal stress in a piezoelectric substrate, a support, and a cover in a first modification of the first preferred embodiment of the present invention.
Figure 10:
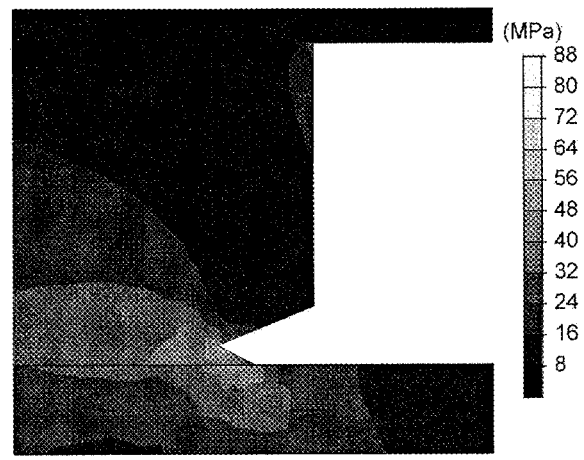
FIG. 10 is an enlarged front sectional view illustrating the distribution of thermal stress in a piezoelectric substrate, a support, and a cover in a second modification of the first preferred embodiment of the present invention.

As described above, the positions and shapes of the recesses are not particularly limited. FIG. 9 is an enlarged front sectional view illustrating the distribution of thermal stress in a piezoelectric substrate, a support, and a cover in a first modification of the first preferred embodiment of the present invention, and FIG. 10 is an enlarged front sectional view illustrating the distribution of thermal stress in a piezoelectric substrate, a support, and a cover in a second modification of the first preferred embodiment of the present invention. As illustrated in FIG. 9, in the first modification of the first preferred embodiment, the recesses are provided along the entirety or substantially the entirety of the outer surface of the support in the height direction. As illustrated in FIG. 10, in the second modification of the first preferred embodiment, the outer surface of the support extends parallel or substantially parallel to the height direction. The recesses are provided in the outer surface so as to extend from a point between the cover and the piezoelectric substrate up to the piezoelectric substrate. As illustrated in FIGS. 9 and 10, the stress is also able to be dispersed in the first modification and the second modification. Therefore, the piezoelectric substrate is unlikely to be damaged.

As in the preferred embodiment illustrated in FIG. 2, the recesses 5 preferably each include the inclined surface 5b that extends to the piezoelectric substrate 2. In this case, the stress acting on the piezoelectric substrate 2 is able to be further dispersed.

The bottom portion 5a of each recess 5 is preferably closer to the piezoelectric substrate 2 than to the cover 6 in the height direction. The piezoelectric substrate 2 side of support does not easily deform. Therefore, stress is likely to be concentrated in the piezoelectric substrate 2. Therefore, the stress acting on the piezoelectric substrate 2 is able to be further dispersed as a result of the bottom portion 5a of each recess 5 being close to the piezoelectric substrate 2.

It is preferable that the recess 5 is provided at at least one corner of the support 4 in a plan view. As illustrated in FIG. 4, stress acts on the piezoelectric substrate 2 at the portions of the piezoelectric substrate 2 that contact the sides 4d of the rectangular or substantially rectangular frame-shaped planar shape of the support 4. Since two sides 4d contact each other at each corner 4e, stress acting on the piezoelectric substrate 2 is particularly likely to be concentrated at the corners 4e. Therefore, as illustrated in FIG. 3, the stress acting on the piezoelectric substrate 2 is able to be effectively dispersed by providing the recess 5 at a corner 4e. More preferably, the recesses 5 are provided at all of the corners 4e of the support 4. In this case, the stress acting on the piezoelectric substrate 2 is able to be further dispersed.

The recesses 5 are preferably provided in the outer surface 4c of the support 4. Thermal stress acts on the piezoelectric substrate 2 from support 4 in directions from the outer surface 4c side of the support 4 toward the inner surface 4b side of the support 4. Therefore, stress acting on the piezoelectric substrate 2 is particularly large on the outer surface 4c side. Consequently, stress acting on the piezoelectric substrate 2 is able to be effectively dispersed by providing the recesses 5 in the outer surface 4c.

As described above, it is sufficient that the recesses 5 are provided in at least one of the inner surface 4b and the outer surface 4c of the support 4. In this case as well, stress acting in the vicinity of the portions at which the surface in which the recesses 5 are provided, of the inner surface 4b and the outer surface 4c, and the piezoelectric substrate 2 contact each other is able to be dispersed and the piezoelectric substrate 2 is unlikely to be damaged.

Figure 11:
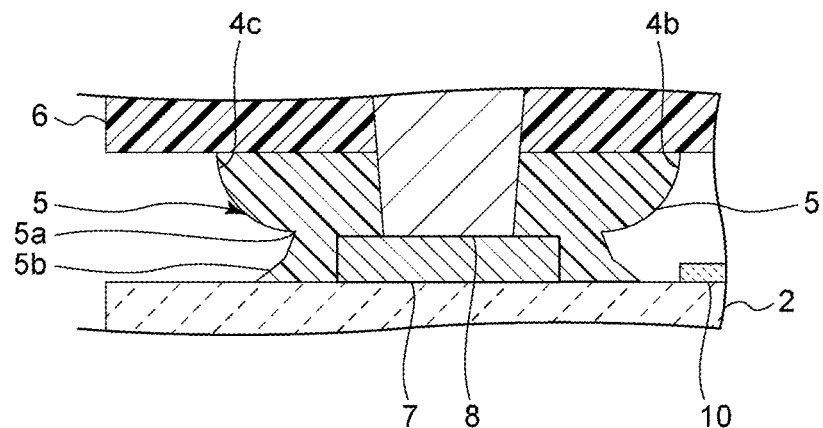
FIG. 11 is an enlarged front sectional view of a region in the vicinity of a support in a third modification of the first preferred embodiment of the present invention.

FIG. 11 is an enlarged front sectional view of a region in the vicinity of a support in a third modification of the first preferred embodiment.

In the third modification, the recesses 5 are provided in the inner surface 4b and the outer surface 4c of the support 4. In this case, the stress acting in the vicinity of the portions of the piezoelectric substrate 2 that contact the inner surface 4b of the support 4 and in the vicinity of the portions of the piezoelectric substrate 2 that contact the outer surface 4c of the support 4 is able to be effectively dispersed. Therefore, the piezoelectric substrate 2 is even less likely to be damaged.

Figure 12:
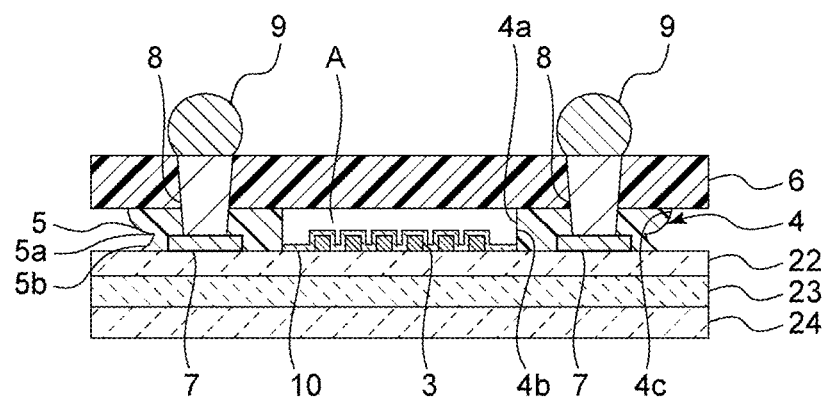
FIG. 12 is a front sectional view of an acoustic wave device according to a fourth modification of the first preferred embodiment of the present invention.

The piezoelectric body is the piezoelectric substrate 2 in the first preferred embodiment, but the piezoelectric body may instead be a piezoelectric thin film 22 as in a fourth modification of the first preferred embodiment illustrated in FIG. 12. For example, a low-acoustic-velocity film 23 may be provided on the surface of the piezoelectric thin film 22 on the opposite side from the surface of the piezoelectric thin film 22 on which the IDT electrode 3 is provided. A high-acoustic-velocity layer 24 may be provided on a surface of the low-acoustic-velocity film 23 that is on the opposite side from the piezoelectric thin film 22.

Here, the low-acoustic-velocity film 23 is a film in which the acoustic velocity of a propagating bulk wave is lower than the acoustic velocity of an acoustic wave propagating along the piezoelectric thin film 22. For example, the low-acoustic-velocity film 23 is preferably made of a material including a main component that is a compound obtained by adding fluorine, carbon, or boron to glass, silicon oxynitride, tantalum oxide, or silicon oxide. It is sufficient that the material of the low-acoustic-velocity film 23 is a material having a relatively low acoustic velocity.

The high-acoustic-velocity layer 24 is a layer in which the acoustic velocity of a propagating bulk wave is higher than the acoustic velocity of an acoustic wave propagating along the piezoelectric thin film 22. For example, the high-acoustic-velocity layer 24 is preferably made of a material having aluminum nitride, aluminum oxide, silicon carbide, silicon oxynitride, a DLC film or diamond as a main component. In addition, it is sufficient that the material of the high-acoustic-velocity layer 24 is a material having a relatively high acoustic velocity.

The high-acoustic-velocity layer 24 may be a high-acoustic-velocity film or may be a high-acoustic-velocity substrate. When the low-acoustic-velocity film 23 and the high-acoustic-velocity layer 24 are provided in this manner, the energy of acoustic waves is able to be effectively confined.

Hereafter, a non-limiting example of a method of manufacturing the acoustic wave device of the first preferred embodiment will be described.

Figure 13A:
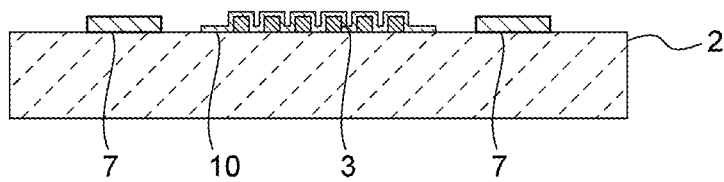
FIGS. 13A to 13C are front sectional views for describing an example of a method of manufacturing the acoustic wave device according to the first preferred embodiment of the present invention.
Figure 13B:
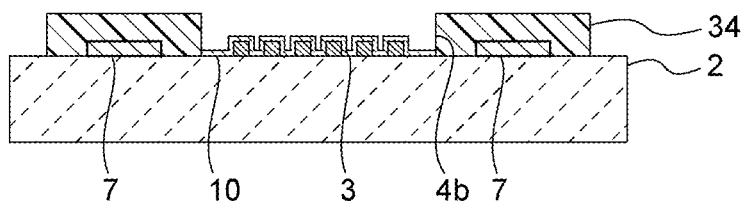
Figure 13C:
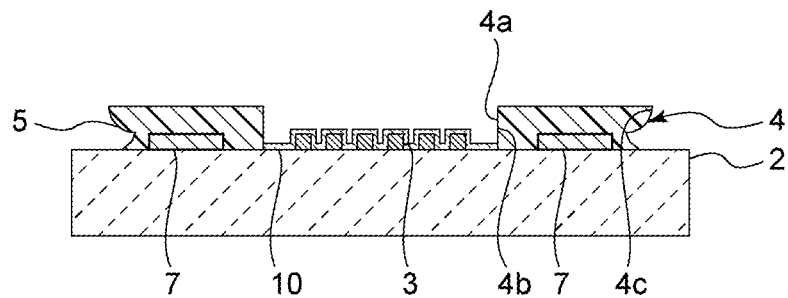
Figure 14A:
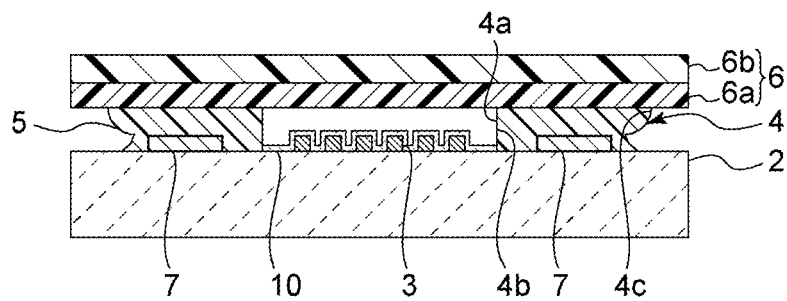
FIGS. 14A to 14C are front sectional views for describing an example of a method of manufacturing the acoustic wave device according to the first preferred embodiment of the present invention.
Figure 14B:
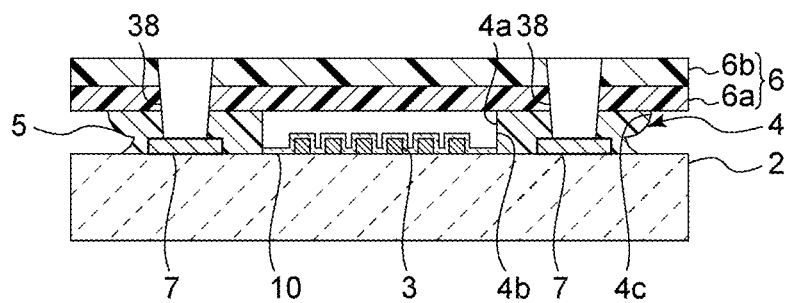
Figure 14C:
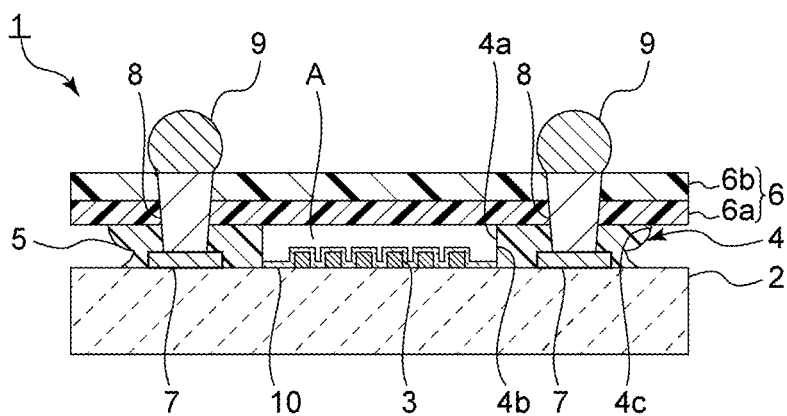

FIGS. 13A to 13C are front sectional views for describing a non-limiting example of a method of manufacturing the acoustic wave device according to the first preferred embodiment. FIGS. 14A to 14C are front sectional views for describing a non-limiting example of a method of manufacturing the acoustic wave device according to the first preferred embodiment.

As illustrated in FIG. 13A, the IDT electrode 3 is formed on the piezoelectric substrate 2. The IDT electrode 3 may be formed using a lift-off method, a sputtering method, or other suitable method, for example. In the case in which a sputtering method is used, a metal film that is for forming the IDT electrode 3 is formed using a sputtering method. Next, a resist pattern is formed on the metal film using a photolithography method. Next, the IDT electrode 3 may be formed by patterning the metal film along the resist pattern using a dry etching method. The electrode pads 7 are formed at the same time as the IDT electrode 3.

Next, the dielectric film 10 is formed on the piezoelectric substrate 2 so as to cover the IDT electrode 3. The dielectric film 10 may be formed using a sputtering method or other suitable method, for example. The dielectric film 10 may be formed by performing appropriate patterning using a photolithography method or a dry etching method.

Next, as illustrated in FIG. 13B, a resin layer 34 that is for forming the support is formed on the piezoelectric substrate 2 using a spin coating method so as to surround the IDT electrode 3. The resin layer 34 is formed so as to cover the electrode pads 7. The resin material used for the resin layer 34 is not particularly limited and, for example, PI is preferably used as the resin material.

Next, the resin layer 34 is pre-baked. At this time, the temperature of pre-baking is preferably a comparatively high temperature. As a result, the light exposure sensitivity of the resin layer 34 is able to be reduced and it is easier to form recesses in the support formed from the resin layer 34.

Next, the resin layer 34 is baked. In the case in which PI is used as the resin layer 34, the temperature at which baking is performed is preferably about 220° C., for example. It is preferable that the heating temperature is increased quickly when heating is performed in the baking step. As a result, the recesses are easy to form in the support. The resin layer 34 is baked, and consequently, the recesses 5 are formed in the support 4 at the same time that the support 4 is formed, as illustrated in FIG. 13C. The recesses 5 may be instead formed after forming the support 4 by performing cutting on the support 4.

Next, as illustrated in FIG. 14A, the cover 6 is provided on the support 4. At this time, the protective layer 6b may be stacked on the adhesive layer 6a after providing the adhesive layer 6a on the support 4. Alternatively, the cover 6 may be formed by stacking the adhesive layer 6a and the protective layer 6b in advance, and then the cover 6 may be stacked on the support 4.

Next, as illustrated in FIG. 14B, through holes 38 are formed to penetrate through the cover 6 and the support 4. The through holes 38 are formed so as to extend to the electrode pads 7. The through holes 38 may be formed by radiating laser light, performing physical cutting, or other suitable method, for example.

Next, as illustrated in FIG. 14C, the via electrodes 8 are formed inside the through holes 38 using an electroplating method or other suitable method. The via electrodes 8 are formed so as to be connected to the electrode pads 7. Next, bumps 9 are provided so as to be bonded to the via electrodes 8.

Figure 15:
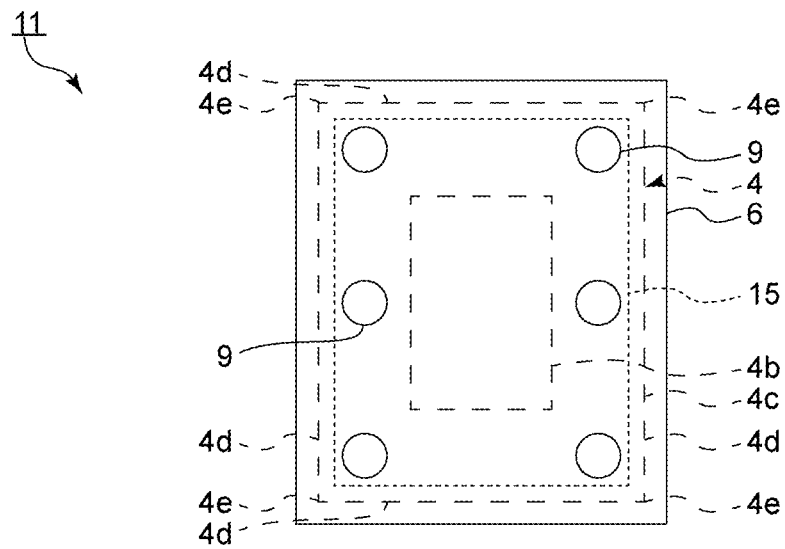
FIG. 15 is a plan view of the acoustic wave device according to a second preferred embodiment of the present invention.

FIG. 15 is a plan view of an acoustic wave device according to a second preferred embodiment of the present invention.

An acoustic wave device 11 differs from the first preferred embodiment in that a recess 15 is provided along the entire or substantially the entire periphery of the outer surface 4c of the support 4 in a plan view. In other respects, the acoustic wave device 11 of the present preferred embodiment has the same or substantially the same configuration as the acoustic wave device 1 of the first preferred embodiment.

In the acoustic wave device 11, the recess 5 is provided along the entire or substantially the entire periphery of the outer surface 4c and locations at which stress is absorbed are uniformly provided over a wide region. In the present preferred embodiment, stress is able to be effectively dispersed along the entirety or substantially the entirety of the portion at which the piezoelectric substrate 2 contacts the outer surface 4c of the support 4. Therefore, the piezoelectric substrate 2 is even less likely to be damaged.

The acoustic wave devices of the above-described preferred embodiments may be used in a duplexer of a radio-frequency front end circuit, for example. An example of this will be described hereafter.

Figure 16:
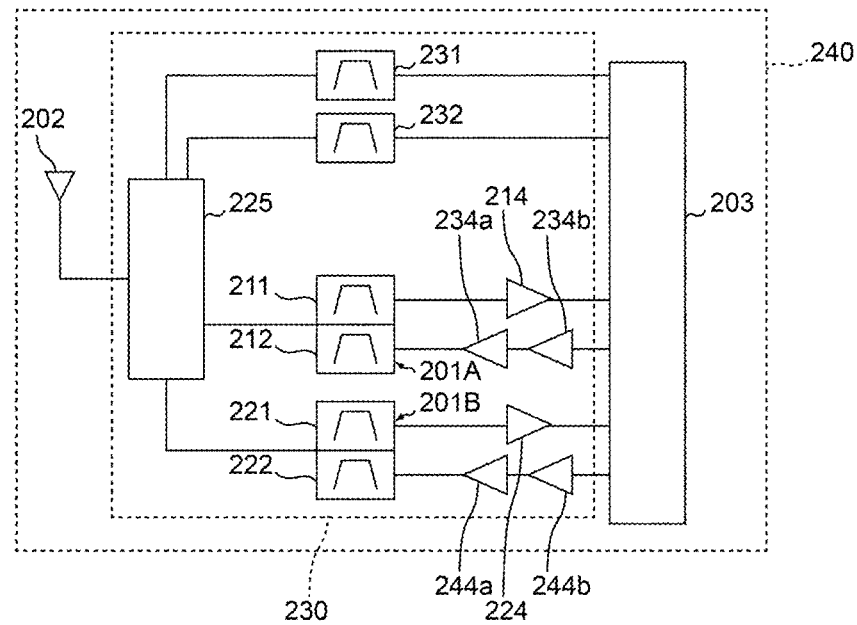
FIG. 16 is a configuration diagram of a communication device that includes a radio-frequency front end circuit.

FIG. 16 is a configuration diagram of a communication device that includes a radio-frequency front end circuit. In the figure, elements connected to a radio-frequency front end circuit 230, such as an antenna element 202 and an RF signal processing circuit (RFIC) 203, for example, are also illustrated. The radio-frequency front end circuit 230 and the RF signal processing circuit 203 define a communication device 240. The communication device 240 may further include a power source, a CPU, and a display, for example.

The radio-frequency front end circuit 230 includes a switch 225, duplexers 201A and 201B, filters 231 and 232, low-noise amplifier circuits 214 and 224, and power amplifier circuits 234a, 234b, 244a, and 244b. The radio-frequency front end circuit 230 and the communication device 240 illustrated in FIG. 16 are merely examples of a radio-frequency front end circuit and a communication device, and the present invention is not limited to these configurations.

The duplexer 201A includes filters 211 and 212. The duplexer 201B includes filters 221 and 222. The duplexers 201A and 201B are connected to the antenna element 202 via the switch 225. The acoustic wave devices according to preferred embodiments of the present invention may be used for the duplexers 201A and 201B and the filters 211, 212, 221, and 222.

In addition, the acoustic wave devices according to preferred embodiments of the present invention may also be used for a multiplexer including three or more filters, for example, such as a triplexer in which the antenna terminals of three filters are connected to each other or a hexaplexer in which the antenna terminals of six filters are connected to each other.

In other words, the acoustic wave devices according to preferred embodiments of the present invention may be used for an acoustic wave resonator, a filter, a duplexer, and a multiplexer including three or more filters. In addition, such a multiplexer is not limited to having a configuration that includes both of a transmission filter and a reception filter, and may instead have a configuration that includes only a transmission filter or only a reception filter.

The switch 225 connects the antenna element 202 and a signal path corresponding to a prescribed band to each other in accordance with a control signal from a controller (not illustrated), and is preferably, for example, defined by a single pole double throw (SPDT) switch. In addition, the number of signal paths connected to the antenna element 202 is not limited to one and may be a plurality. In other words, the radio-frequency front end circuit 230 may support carrier aggregation.

The low-noise amplifier circuit 214 is a reception amplification circuit that amplifies a radio-frequency signal (in this case, a radio-frequency reception signal) received via the antenna element 202, the switch 225, and the duplexer 201A and outputs the amplified signal to the RF signal processing circuit 203. The low-noise amplifier circuit 224 is a reception amplification circuit that amplifies a radio-frequency signal (in this case, a radio-frequency reception signal) received via the antenna element 202, the switch 225, and the duplexer 201B and outputs the amplified signal to the RF signal processing circuit 203.

The power amplifier circuits 234a and 234b are transmission amplification circuits that amplify a radio-frequency signal (here, radio-frequency transmission signal) output from the RF signal processing circuit 203 and output the amplified radio-frequency signal to the antenna element 202 via the duplexer 201A and the switch 225. The power amplifier circuits 244a and 244b are transmission amplification circuits that amplify a radio-frequency signal (here, radio-frequency transmission signal) output from the RF signal processing circuit 203 and output the amplified radio-frequency signal to the antenna element 202 via the duplexer 201B and the switch 225.

The RF signal processing circuit 203 subjects a radio-frequency reception signal input thereto from the antenna element 202 via a reception signal path to signal processing using down conversion, for example, and outputs a reception signal generated through this signal processing. In addition, the RF signal processing circuit 203 subjects an input transmission signal to signal processing using up conversion, for example, and outputs a radio-frequency transmission signal generated through this signal processing to the low-noise power amplifier circuit 224. The RF signal processing circuit 203 is preferably an RFIC, for example. In addition, the communication device may include a baseband (BB) IC. In this case, the BBIC subjects a reception signal processed by the RFIC to signal processing. Furthermore, the BBIC subjects a transmission signal to signal processing and outputs the resulting signal to an RFIC. A reception signal processed by the BBIC or a transmission signal prior to being subjected to signal processing by the BBIC is an image signal, an audio signal, or other suitable signal, for example. The radio-frequency front end circuit 230 may include other circuit elements between the above-described elements.

Furthermore, the radio-frequency front end circuit 230 may include duplexers according to modifications of the duplexers 201A and 201B, instead of the duplexers 201A and 201B.

On the other hand, the filters 231 and 232 of the communication device 240 are connected between the RF signal processing circuit 203 and the switch 225 without the low-noise amplifier circuits 214 and 224 or power amplifier circuits 234a, 234b, 244a, and 244b interposed therebetween. The filters 231 and 232 are also connected to the antenna element 202 via the switch 225 similarly to the duplexers 201A and 201B.

The radio-frequency front end circuit 230 and the communication device 240 are able to effectively disperse stress acting on a piezoelectric body, such as a piezoelectric substrate and are unlikely to be damaged as a result of being equipped with an acoustic wave resonator, a filter, a duplexer, a multiplexer including three or more filters, which are achieved using an acoustic wave device according to a preferred embodiment of the present invention.

Acoustic wave devices, radio-frequency front end circuits, and communication devices according to preferred embodiments of the present invention and modifications thereof have been described above, but other preferred embodiments provided by combining any of the elements of the above-described preferred embodiments and modifications with one another, modifications obtained by modifying the above-described preferred embodiments in various ways, as thought of by one skilled in the art, without departing from the gist of the present invention, and various devices including radio-frequency front end circuits and communication devices according to preferred embodiments of the present invention provided therein are also included in the present invention.

Preferred embodiments of the present invention may be widely used in communication devices, such as mobile phone devices, for example, as an acoustic wave resonator, a filter, a duplexer, a multiplexer that may be used in multiband systems, front end circuits, and communication devices.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a piezoelectric body;
   a functional electrode provided on the piezoelectric body;
   a support provided on the piezoelectric body so as to surround the functional electrode; and
   a cover provided on the support; wherein
   the support has a larger thermal expansion coefficient than the piezoelectric body;
   the functional electrode is provided inside a hollow space surrounded by the piezoelectric body, the support, and the cover; and
   the support includes an inner surface on a side of the hollow space, and an outer surface on a side opposite to the inner surface, the inner surface and the outer surface of the support extend in a direction along or substantially along a height direction of the acoustic wave device, and the support includes a recess provided in the outer surface.

2. The acoustic wave device according to claim 1, wherein, when a depth of the recess is a dimension of the recess in a direction that connects the inner surface and the outer surface of the support, a portion of the recess at which the depth is largest is closer to the piezoelectric body than to the cover.

3. The acoustic wave device according to claim 1, wherein the support includes a plurality of corners in a plan view; and
   the recess is provided at at least one of the plurality of corners.

4. The acoustic wave device according to claim 1, wherein the recess is provided in the inner surface and the outer surface of the support.

5. The acoustic wave device according to claim 1, wherein the support has a frame shape in a plan view; and
   the recess is provided along an entire or substantially an entire periphery of the support.

6. The acoustic wave device according to claim 1, wherein the functional electrode is an IDT electrode.

7. A radio-frequency front end circuit comprising:
   the acoustic wave device according to claim 1; and
   a power amplifier.

8. The radio-frequency front end circuit according to claim 7, wherein, when a depth of the recess is a dimension of the recess in a direction that connects the inner surface and the outer surface of the support, a portion of the recess at which the depth is largest is closer to the piezoelectric body than to the cover.

9. The radio-frequency front end circuit according to claim 7, wherein
   the support includes a plurality of corners in a plan view; and
   the recess is provided at at least one of the plurality of corners.

10. The radio-frequency front end circuit according to claim 7, wherein the recess is provided in the inner surface and the outer surface of the support.

11. The radio-frequency front end circuit according to claim 7, wherein
    the support has a frame shape in a plan view; and
    the recess is provided along an entire or substantially an entire periphery of the support.

12. The radio-frequency front end circuit according to claim 7, wherein the functional electrode is an IDT electrode.

13. A communication device comprising:
    the radio-frequency front end circuit according to claim 7; and
    an RF signal processing circuit.

14. The communication device according to claim 13, wherein, when a depth of the recess is a dimension of the recess in a direction that connects the inner surface and the outer surface of the support, a portion of the recess at which the depth is largest is closer to the piezoelectric body than to the cover.

15. The communication device according to claim 13, wherein
- the support includes a plurality of corners in a plan view; and
- the recess is provided at at least one of the plurality of corners.

16. The communication device according to claim 13, wherein the recess is provided in the inner surface and the outer surface of the support.

17. The communication device according to claim 13, wherein
- the support has a frame shape in a plan view; and
- the recess is provided along an entire or substantially an entire periphery of the support.

* * * * *